(12) United States Patent
Qiao et al.

(10) Patent No.: US 12,382,679 B2
(45) Date of Patent: Aug. 5, 2025

(54) SEMICONDUCTOR DEVICE AND MANUFACTURING METHOD

(71) Applicants: University of Electronic Science and Technology of China, Chengdu (CN); Institute of Electronic and Information Engineering of UESTC in Guangdong, Dongguan (CN)

(72) Inventors: Ming Qiao, Chengdu (CN); Ruidi Wang, Chengdu (CN); Yibing Wang, Chengdu (CN); Wenyang Bai, Chengdu (CN); Bo Zhang, Chengdu (CN)

(73) Assignees: University of Electronic Science and Technology of China, Chengdu (CN); Institute of Electronic and Information Engineering of UESTC in Guangdong, Dongguan (CN)

( * ) Notice: Subject to any disclaimer, the term of this patent is extended or adjusted under 35 U.S.C. 154(b) by 644 days.

(21) Appl. No.: 17/831,454

(22) Filed: Jun. 3, 2022

(65) Prior Publication Data

US 2023/0129440 A1    Apr. 27, 2023

(30) Foreign Application Priority Data

Oct. 27, 2021  (CN) .......................... 202111254973.4

(51) Int. Cl.
| | |
|---|---|
| H01L 21/265 | (2006.01) |
| H01L 21/266 | (2006.01) |
| H01L 21/761 | (2006.01) |
| H10D 30/01 | (2025.01) |
| H10D 30/66 | (2025.01) |
| H10D 62/10 | (2025.01) |
| H10D 62/17 | (2025.01) |

(52) U.S. Cl.
CPC ...... H10D 62/111 (2025.01); H01L 21/26513 (2013.01); H01L 21/266 (2013.01); H01L 21/761 (2013.01); H10D 30/0291 (2025.01); H10D 30/66 (2025.01); H10D 62/393 (2025.01)

(58) Field of Classification Search
CPC .................................................. H10D 30/0291
See application file for complete search history.

(56) References Cited

U.S. PATENT DOCUMENTS 5,382,538 A  *  1/1995  Zambrano ............ H10D 62/393
                                           257/E29.066

FOREIGN PATENT DOCUMENTS

| CN | 108538918 | * | 9/2018 | ......... H10D 30/0291 |
| CN | 109065612 | * | 12/2018 | ......... H10D 30/0291 |

* cited by examiner

*Primary Examiner* — William B Partridge
*Assistant Examiner* — Megan Parrish
(74) *Attorney, Agent, or Firm* — Bayramoglu Law Offices LLC

(57) ABSTRACT

A method for manufacturing a semiconductor device is provided. A drift region and a compensation region are formed through a deep trench etching and a filling technology. A plurality of modulation doping regions are formed at a top of the drift region by an epitaxy and an ion implantation. A modulation region is introduced, wherein the modulation region flexibly modifies capacitance characteristics and achieve improved dynamic characteristics.

18 Claims, 16 Drawing Sheets

SEMICONDUCTOR DEVICE AND MANUFACTURING METHOD

CROSS REFERENCE TO THE RELATED APPLICATIONS

This application is based upon and claims priority to Chinese Patent Application No. 202111254973.4, filed on Oct. 27, 2021, the entire contents of which are incorporated herein by reference.

TECHNICAL FIELD

The present disclosure relates to the field of semiconductor, in particular to a manufacturing method of a semiconductor device with adjustable dynamic characteristics.

BACKGROUND

As the core device to manage high voltage and large current in power systems, power vertical double-diffuse MOSFET is one of the most applicable power devices in PFC, DC-DC, and many other power circuits. High breakdown voltage (BV), low power loss, and improved dynamic characteristics are the important trends in the development of power MOSFETs.

As the representative of the advanced power device, super-junction MOSFET realizes low specific on-state resistance ($R_{on,sp}$) and high BV by its unique charge compensation technology, thereby remarkably improving efficiency and reducing power loss of systems. Currently, there are two main manufacturing methods to form a super-junction structure. One is the deep trench etching and filling process. The other is the multi-epitaxy and multi-implantation process. The deep trench etching and filling process does not introduce a high-temperature thermal process. Therefore, this method can fabricate super-junction devices with a small cell-pitch. It is beneficial to realize extremely low $R_{on,sp}$ but is difficult to modify the doping distribution locally. Devices obtained by deep trench etching and filling process generally suffer from poor dynamic characteristics. In contrast, the multi-epitaxy and multi-implantation process can flexibly adjust the mask and dose of each implantation to modify the doping distribution of the super-junction. However, the multi-epitaxy and multi-implantation process has the disadvantages of complex process, time-consuming, and high cost. Besides, due to the limitation of the diffusion process, it is difficult to further narrow the super-junction pitch for the multi-epitaxy and multi-implantation process.

In order to solve the above technical problems, this invention provides a manufacturing method of semiconductor device. The proposed method has the advantages of easy production, small cell-pitch, and low-cost. Besides, the capacitance characteristics can be flexibly modified by adjusting the doping distribution of the dynamic characteristic modulation region. The proposed manufacturing method alleviates the contradiction between the manufacturing cost and the dynamic characteristics.

SUMMARY

The present invention provides a manufacturing method of a semiconductor device, which is characterized by:
step 1: providing a first type substrate 101;
step 2: forming a first type buffer layer 102 on the upper surface of the first type substrate 101 by epitaxy;
step 3: forming a first type epitaxial layer on the upper surface of the first type buffer layer 102, and etching with a mask to obtain a plurality of alternately arranged trenches;
step 4: obtaining a plurality of alternately arranged first type drift regions 103 and second compensation regions 104 by filling the trenches with a second type semiconductor material and planarization;
step 5: forming an epitaxial layer on surfaces of the first type drift regions 103 and the second compensation regions 104, and forming a first type modulation region 105 by ion implantation;
step 6: forming second type modulation regions 106 on the upper surface of the epitaxial layer by ion implantation with a mask;
step 7: forming an epitaxial layer on the upper surface of the first type modulation region 105, and adjusting the doping concentration of the epitaxial layer by ion implantation;
step 8: growing gate dielectric material on the surface of the epitaxial layer, and depositing gate electrode material on the surface of the gate dielectric;
step 9: forming a gate dielectric 111 and a gate electrode 112 by etching with a mask;
step 10: performing an ion implantation by self-aligned technique;
step 11: forming second type body regions 108 by annealing;
step 12: forming first type source regions 109 by ion implantation on surfaces of the second type body regions 108 with a mask;
step 13: depositing a passivation layer 113 on the upper surface of the device, and etching with a mask to form source contact holes;
step 14: forming second type body contact regions 110 by ion implantation through the source contact holes;
step 15: depositing a source electrode 114 on the upper surface of the device, and etching with a mask.

A semiconductor device obtained by the above manufacturing process comprises:
A first type substrate 101; A first type buffer layer 102 is located above the first type substrate 101; A plurality of first type drift regions 103 and second type compensation regions 104 are alternately arranged above the first type buffer layer 102; A plurality of first type modulation regions 105 and second type modulation regions 106 are alternately arranged above the first type drift region 103 and the second type compensation region 104; A plurality of body structures are located above the second type modulation region 106, which comprises a second type body region 108, a first type source region 109 and a second type body contact region 110; A first type neck region 107 is located between the two adjacent body structures; A gate structure is located above the upper surface of the semiconductor, which comprises a gate dielectric 111 and a gate electrode 112 located above the upper surface of the gate dielectric 111; A passivation layer 113 is located above the gate structure; A source electrode 114 is located on the above structure and connects the first type source region 109 and the second type body contact region 110.

Preferably, the doping concentration of the second type modulation region 106 is different from that of the second type compensation region 104.

Preferably, the first type modulation region 105 and the second type modulation region 106 are formed by multi-implantation after a single epitaxy.

Preferably, the first type modulation region 105 is formed by the multi-epitaxy process. The second type modulation region 106 is formed by multi-epitaxy and one or more ion implantations after each epitaxy.

Preferably, the second type compensation region 104 is not in contact with the second type modulation region 106 by adjusting the thickness of the first type epitaxial layer in step 5, the energy of the ion implantation in step 6, or/and the temperature and time during subsequent annealing process.

Preferably, before the epitaxy in step 3, a first type bottom modulation region 805 is formed on the upper surface of the first type buffer layer 102. After that, a second type bottom modulation region 806 is formed by ion implantation.

Preferably, the angle φ of the trench sidewalls in step 3 is adjusted in a range of 0° to 5°.

Preferably, a novel mask is used to obtain the second type modulation region 106, which is arranged periodically with the first type modulation region 105. In the gate width direction, the second type modulation region 106 separates the first type modulation region 105 at intervals.

Preferably, a novel mask is used to obtain the second type modulation region 106, which is arranged periodically with the first type modulation region 105. In the gate width direction, the second type modulation region 106 extends into the first type modulation region 105 at intervals.

Preferably, after forming the first type modulation region 105 in step 5, a drift region isolation layer 1215 is introduced by deep trench etching with deposition or oxidation. The drift region isolation layer 1215 separates the first type drift region 103 and the second type compensation region 104. The drift region isolation layer 1215 separates the first type modulation region 105 and the second type modulation region 106.

Preferably, after forming the first type neck region 107 in step 7, a drift region isolation layer 1215 is introduced by deep trench etching with deposition or oxidation. The drift region isolation layer 1215 separates the first type drift region 103 and the second type compensation region 104. The drift region isolation layer 1215 separates the first type modulation region 105 and the second type modulation region 106. In addition, after etching the source contact hole in step 13, a metal film is sputtered on the upper surface of the second type body region 108 to form a Schottky contact.

The present invention further provides a semiconductor device, which includes: a first type substrate 101; a first type buffer layer 102 is located above the first type substrate 101; first type drift regions 103 and second type compensation regions 104 are alternately arranged above the first type buffer layer 102; a first type modulation regions 105 is located above the first type drift regions 103; a second type modulation region 106 is located above the second type compensation region 104; a trench region 1412 is located above the first type modulation regions 105; a gate dielectric 111 is located on the side wall and bottom of the trench region, a gate electrode 112 is located inside the gate dielectric 111; second type body regions 108 are located above the second type modulation region 106; first type source regions 109 and second type body contact regions 110 are located inside the second type body regions 108 and in contact with each other, wherein the second type body regions 108 and the first type source regions 109 are in contact with the trench region 1412; a passivation layer 113 is located above the trench region 1412 and the first type source region 109; a source electrode 114 is located above the passivation layer 113 and in contact with the first type source region 109 and the second type body contact region 110.

Preferably, the top of the second type modulation region 106 is located above the bottom of the trench region 1412, and the trench region 1412 is in contact with the first type drift region 103. The first type modulation region 105 is located between the adjacent second type modulation region 106 and the trench region 1412.

Preferably, the first type is n-type while the second type is p-type. It is, however, also possible that the first type is p-type and the second type is n-type.

The present invention realizes the easy adjustment of the doping distribution at the top of the super-junction while maintaining low cost and simple process. A modulation region is introduced to modify capacitance characteristics and achieve improved dynamic characteristics.

101 is first type substrate, 102 is first type buffer layer, 103 is first type drift region, 104 is second type compensation region, 105 is first type modulation region, 106 is second type modulation region, 107 is first type neck region, 108 is second type body region, 109 is first type source region, 110 is second type body contact region, 111 is gate dielectric, 112 is gate electrode, 113 is passivation layer, 114 is source electrode, 506a is first modulation doping region, 506b is second modulation doping region, 605a is first type first layer modulation doping region, 605b is first type second layer modulation doping region, 606a is second type first layer modulation doping region, 606b is second type second layer modulation doping region, 805 is first type bottom modulation region, 806 is second type bottom modulation region, 1006 is second type implantation mask, 1007 is gate etching region, 1215 is drift region isolation layer, and 1412 is trench region.

DETAILED DESCRIPTION OF THE EMBODIMENTS

Embodiments of the present invention are described below by way of specific examples, and other advantages and effects of the present invention will be readily apparent to those skilled in the art from the disclosure of the description. The present invention may also be practiced or applied by other detailed descriptions, and the details of this specification may be modified or altered from different viewpoints and applications without departing from the spirit of the present invention.

Embodiment 1

Figure 1:
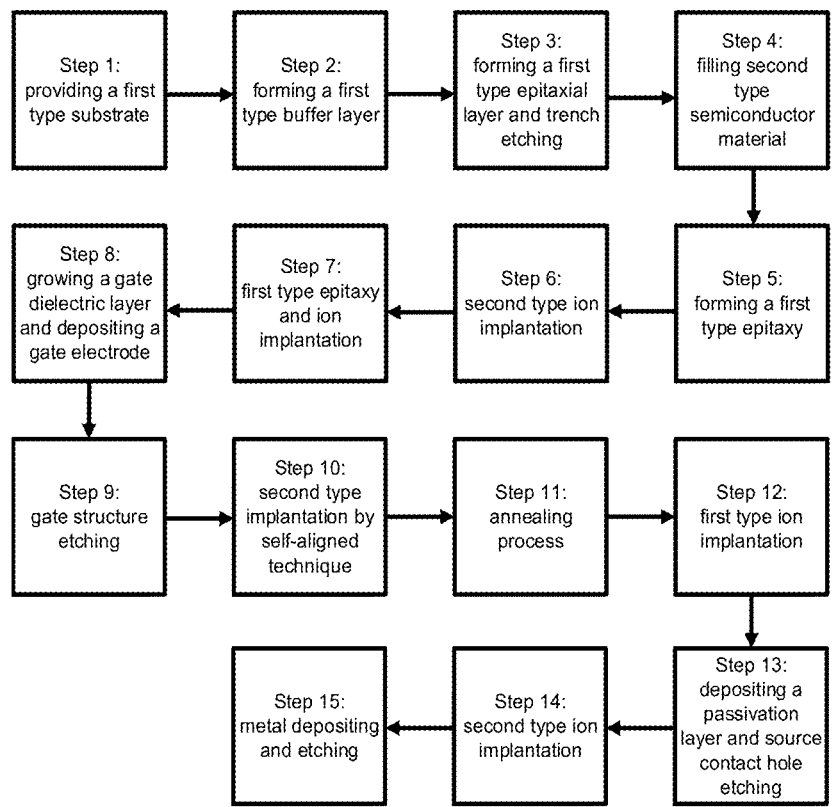
FIG. 1 is a manufacturing process flow proposed by the present invention.
Figure 3A:
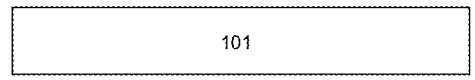
FIG. 3A is a structural schematic diagram of a substrate provided in the process flow of the present invention.
Figure 3B:
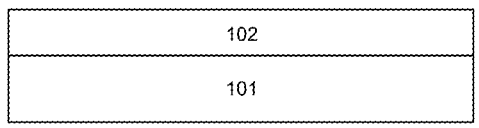
FIG. 3B is a schematic diagram of a structure obtained after forming a first type buffer region on the upper surface of the substrate by epitaxy in the process flow of the present invention.
Figure 3C:
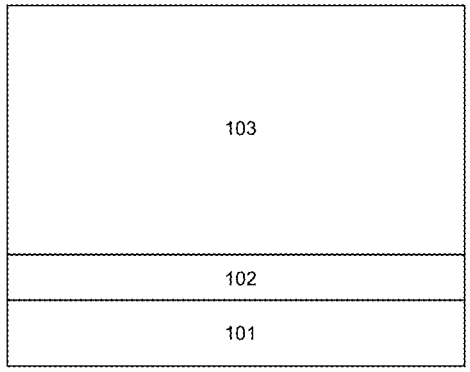
FIG. 3C is a schematic diagram of a structure obtained after forming a first type epitaxial layer on the upper surface of the first type buffer region in the process flow of the present invention.
Figure 3D:
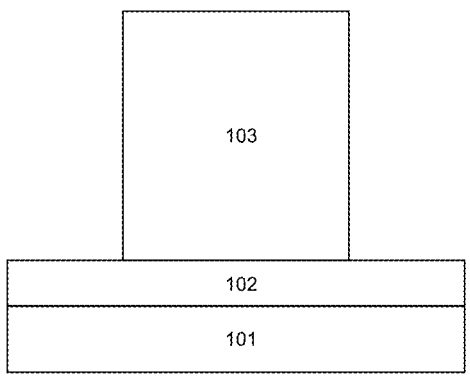
FIG. 3D is a structural schematic diagram of alternately arranged trenches obtained by deep trench etching in the process flow of the present invention.
Figure 3E:
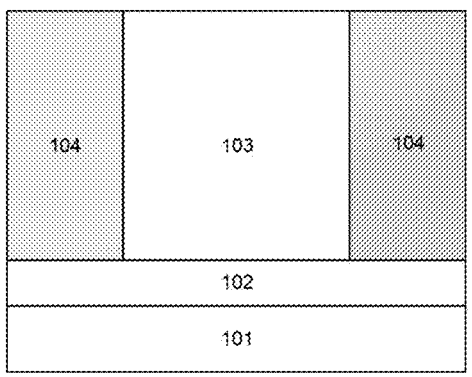
FIG. 3E is a schematic diagram of a structure obtained by filling a second type of semiconductor into the trench and performing a planarization in the process flow of the present invention.
Figure 3F:
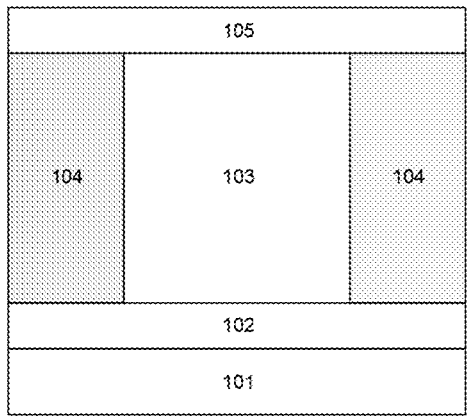
FIG. 3F is a schematic diagram of a structure obtained after forming a first type modulation region on surfaces of the first type drift region and the second type compensation region by epitaxy in the process flow of the present invention.
Figure 3G:
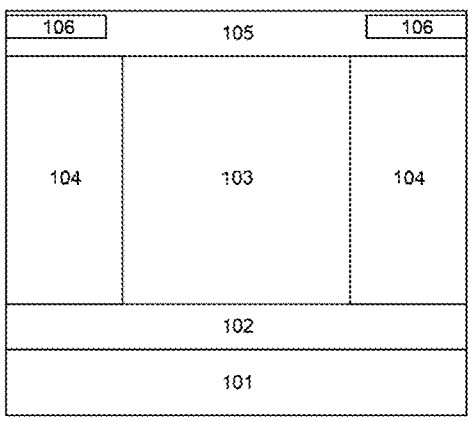
FIG. 3G is a schematic diagram of a structure obtained after forming a second type modulation region on the upper surface of the epitaxial layer by ion implantation with a mask in the process flow of the present invention.
Figure 3H:
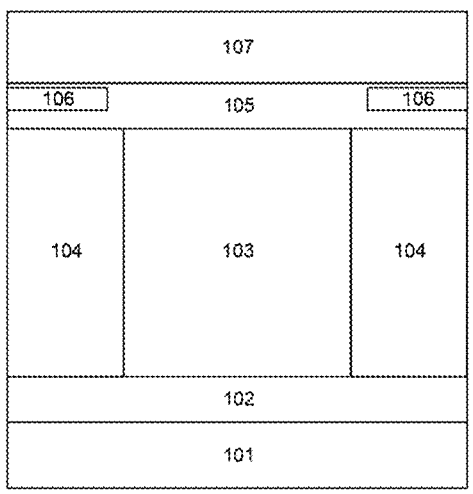
FIG. 3H is a schematic diagram of a structure obtained after forming a first type epitaxial layer on the surface of the first type modulation region in the process flow of the present invention.
Figure 3I:
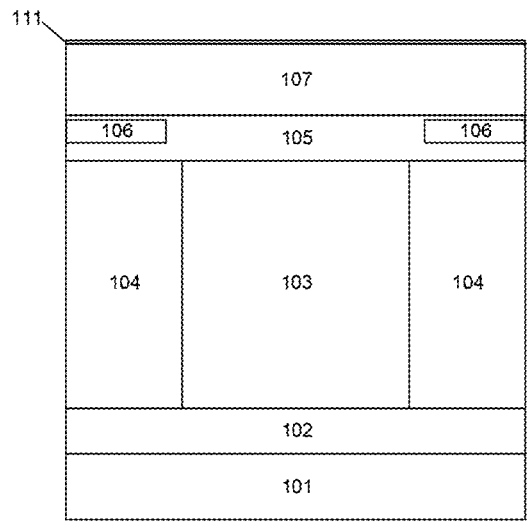
FIG. 3I is a schematic diagram of a structure obtained after forming gate dielectric material on the surface of the first type epitaxial layer in the process flow of the present invention.
Figure 3J:
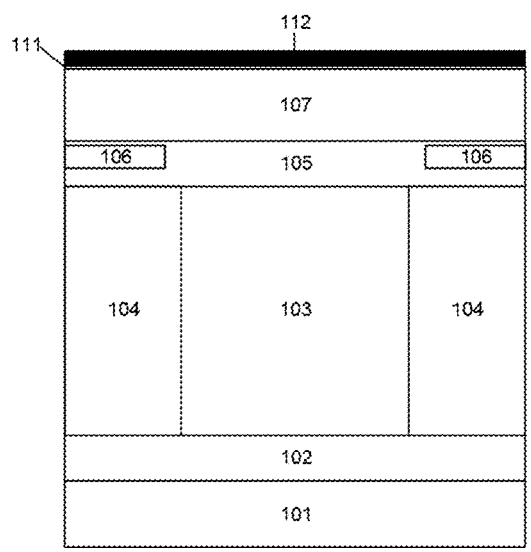
FIG. 3J is a schematic diagram of a structure obtained after depositing gate electrode material on the surface of the gate dielectric layer in the process flow of the present invention.
Figure 3K:
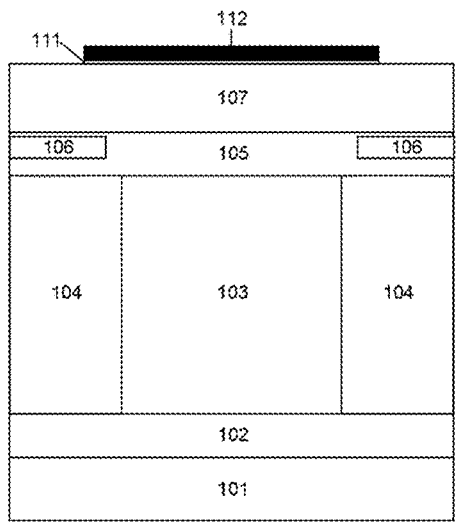
FIG. 3K is a schematic diagram of a structure obtained after forming a gate dielectric and a gate electrode by etching in the process flow of the present invention.
Figure 3L:
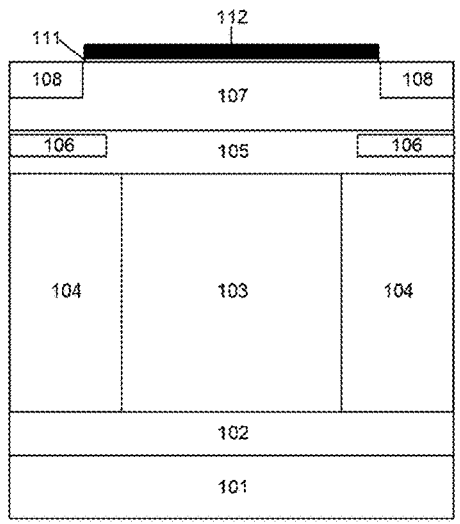
FIG. 3L is a schematic diagram of a structure obtained by forming a second type body region by a self-aligned implantation in the process flow of the present invention.
Figure 3M:
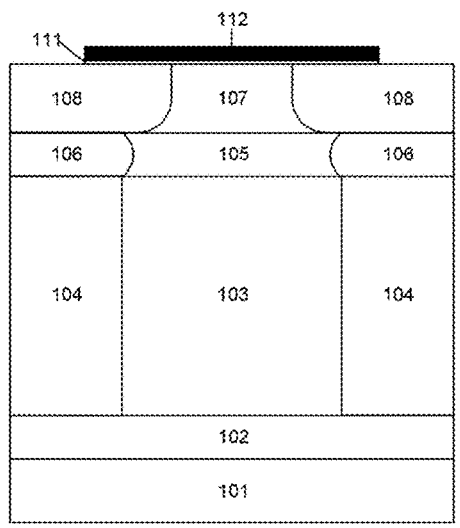
FIG. 3M is a schematic diagram of a structure obtained after annealing in the process flow of the present invention.
Figure 3N:
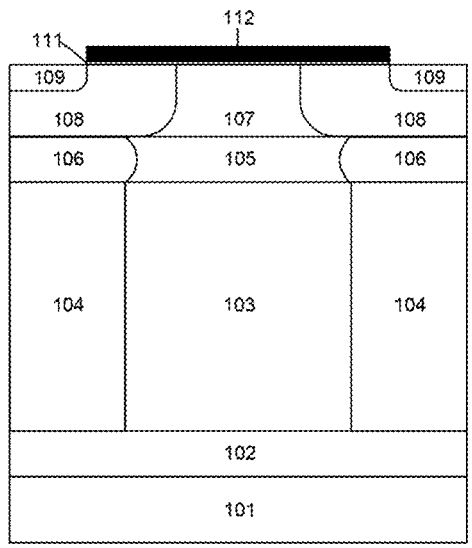
FIG. 3N is a schematic diagram of a structure obtained after forming a first type source region by performing an ion implantation on the surface of the second type body region in the process flow of the present invention.
Figure 3O:
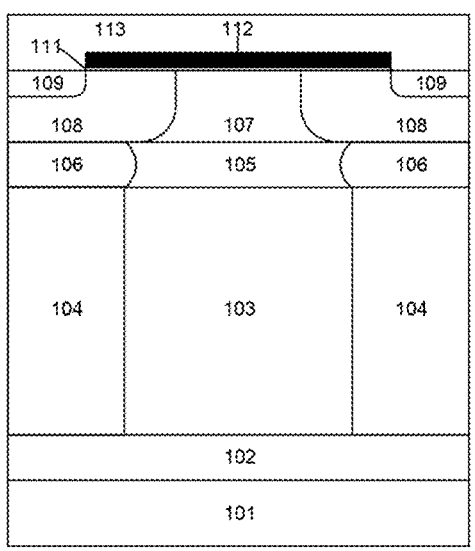
FIG. 3O is a schematic diagram of a structure obtained after depositing a passivation layer on the upper surface of the device in the process flow of the present invention.
Figure 3P:
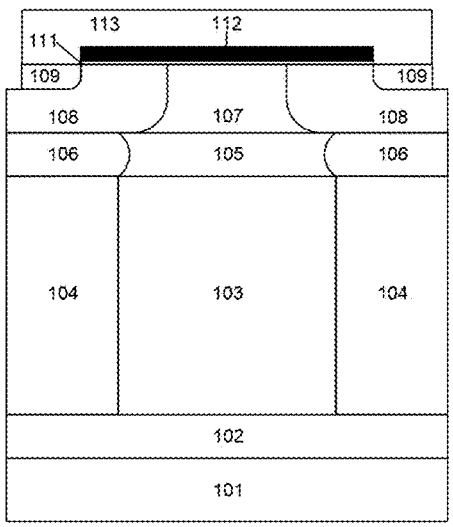
FIG. 3P is a schematic diagram of a structure obtained after forming source contact holes by etching in the process flow of the present invention.
Figure 3Q:
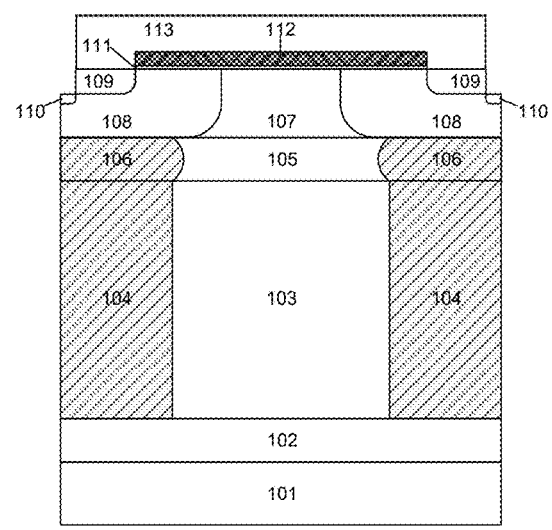
FIG. 3Q is a schematic diagram of a structure obtained after forming second type body contact regions by ion implantation in the process flow of the present invention.
Figure 3R:
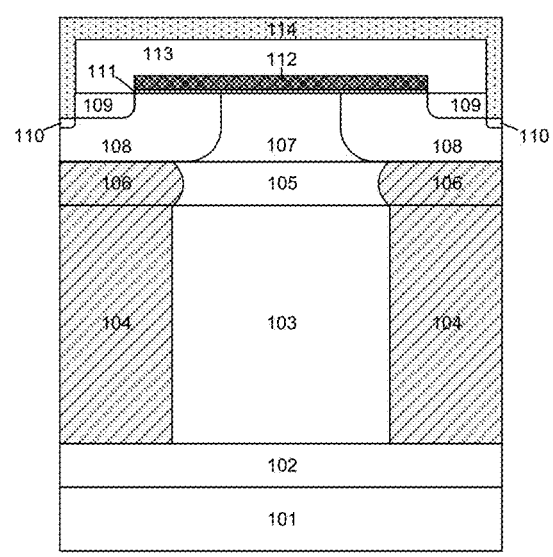
FIG. 3R is a schematic diagram of a structure obtained by depositing a source electrode on the upper surface of the device in the process flow of the present invention.
Figure 10A:
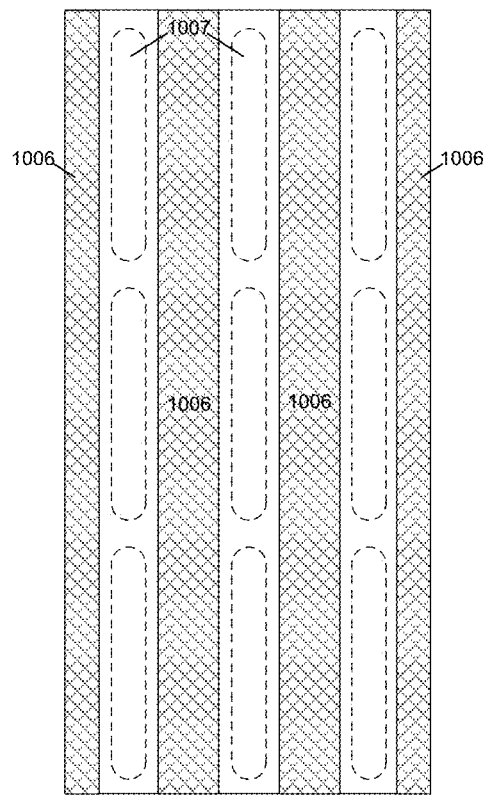
FIG. 10A is a schematic structural diagram of the mask adopted in step 6 in the process flow of Embodiment 1 of the present invention.

As shown in FIG. 1, the present invention provides a manufacturing method of a semiconductor device, which comprises:

step 1: as shown in FIG. 3A, a first type substrate 101 is provided;

step 2: as shown in FIG. 3B, a first type buffer layer 102 is formed on the upper surface of the first type substrate 101 by epitaxy;

step 3: as shown in FIGS. 3C and 3D, a first type epitaxial layer is formed on the upper surface of the first type buffer layer 102, and etching the first type epitaxial layer with a mask to obtain alternately arranged trench structures;

step 4: as shown in FIG. 3E, a plurality of alternately arranged first type drift regions 103 and second type compensation regions 104 are obtained by filling second doping type semiconductor into the trenches by a deposition process and planarization;

step 5: as shown in FIG. 3F, an epitaxy layer is formed on surfaces of the first type drift regions 103 and second type compensation regions 104, and a first type modulation region 105 is formed by adjusting the doping concentration of the epitaxial layer;

step 6: as shown in FIG. 3G, second doping type modulation regions 106 are formed on the upper surface of the epitaxial layer by ion implantation with a mask as shown in FIG. 10A;

step 7: as shown in FIG. 3H, an epitaxy layer is formed on the surface of the first type modulation region 105, and the doping concentration of the epitaxial layer is adjusted by ion implantation;

step 8: as shown in FIGS. 3I and 3J, gate dielectric material is grown on the surface of the epitaxial layer, and gate electrode material is deposited on the surface of the gate dielectric material;

step 9: as shown in FIG. 3K, a gate dielectric 111 and a gate electrode 112 are formed by etching with the mask;

step 10: as shown in FIG. 3L, ion implantation is performed by self-aligned technique;

step 11: as shown in FIG. 3M, second type body regions 108 are formed by annealing, at the same time, the second type body regions 108 are connected with the second type modulation regions 106, and the second type modulation regions 106 are connected with the second type compensation region 104;

step 12: as shown in FIG. 3N, first type source regions 109 is formed by ion implantation on surfaces of the second type body regions 108 with a mask;

step 13: as shown in FIGS. 3O and 3P, a passivation layer 113 is deposited on the upper surface of the device, and source contact holes are formed by etching with a mask;

step 14: as shown in FIG. 3Q, second type body contact regions 110 are formed by performing ion implantation through the source contact hole;

step 15: as shown in FIG. 3R, a source electrode 114 is formed on the upper surface of the device by depositing and etching with a mask.

Figure 2:
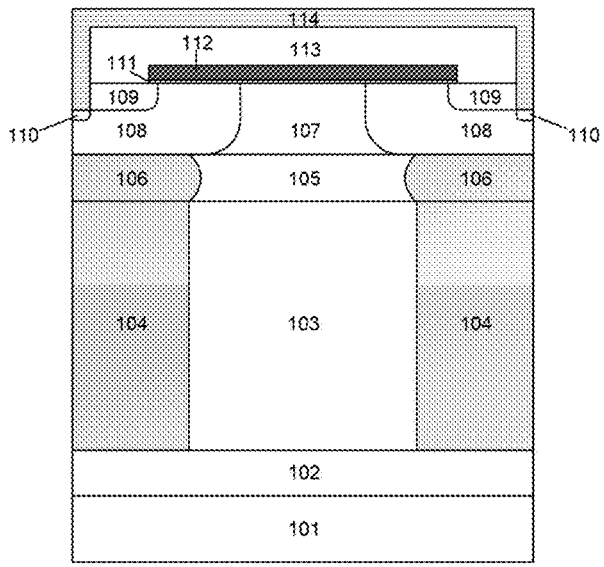
FIG. 2 is a structural schematic diagram of the semiconductor device proposed by the present invention.

A semiconductor device obtained by the above steps, as shown in FIG. 2, includes:

A first type substrate 101; A first type buffer layer 102 is located above the first type substrate 101; A plurality of first type drift regions 103 and second type compensation regions 104 are alternately arranged above the first type buffer layer 102; A plurality of first type modulation regions 105 and second type modulation regions 106 are alternately arranged above the first type drift region 103 and the second type compensation region 104; A plurality of body structures are located above the second type modulation region 106, which comprises a second type body region 108, a first type source region 109 and a second type body contact region 110; A first type neck region 107 is located between the two adjacent body structures; A gate structure is located above the upper surface of the semiconductor, which comprises a gate dielectric 111 and a gate electrode 112 located above the upper surface of the gate dielectric 111; A passivation layer 113 is located above the gate structure; A source electrode 114 is located on the above structure contacting the first type source region 109 and the second type body contact region 110.

According to the process method of this embodiment, as shown in FIG. 3D and FIG. 3E, a plurality of alternately arranged first type drift regions 103 and second type compensation regions 104 are formed by deep trench etching and filling technology. During the deep trench etching and filling process, the temperature is lower than 1000° C. As a result, it does not introduce significant diffusion and compensation in the first type drift regions 103 and the second type compensation regions 104. In addition, a steeper concentration gradient is realized on both sides of the PN junction, which is beneficial to reduce the cell-pitch and $R_{on,sp}$.

As shown in FIG. 3F and FIG. 3G, The first type modulation regions 105 are formed by epitaxy on the upper surface of the drift region. The second type modulation regions 106 are formed by ion implantation with a mask. Because the thickness of the epitaxial layer, the implantation dose, and implantation energy can be adjusted, the doping distribution of the first type modulation regions 105 can be different from that of the first type drift region 103, and the doping distribution of the second type modulation regions 106 can be different from that of the second type compensation region 104. For example, the concentration of the second type modulation regions 106 is higher than that of the second doping type compensation regions 104. As a result, the second doping type drift region of the device is hard to be fully depleted under a high drain voltage, and the charge coupling between the drain and the source is enhanced. The concentration of the first type modulation region 105 is lower than that of the second type modulation region 106. As a result, the top of the drift region can be depleted at a lower drain voltage, reducing the gate-drain capacitance ($C_{GD}$).

The 600V super-junction MOSFET formed by the multi-epitaxy and multi-implantation process generally requires more than six epitaxy processes. However, the super-junction MOSFET of this embodiment only needs two epitaxy processes of step 3 and step 5, which retains the same manufacturing cost and process time as to the deep trench etching and filling process, and retains the ability to realize dynamic characteristic optimization by local structure adjustment.

Figure 4A:
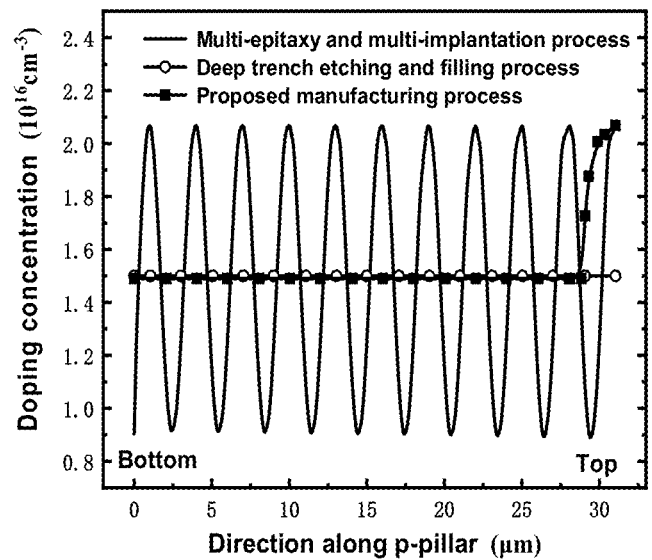
FIG. 4A compares the doping concentration along the center of the n-pillar from bottom to top of the super-junction MOSFET provided in Embodiment 1 with the same type super-junction MOSFET obtained by only using a multi-epitaxy and multi-implantation process and the same type super-junction MOSFET obtained by only using a deep trench etching and filling process in the prior art.

FIG. 4A compares the doping concentration in the center of the n-pillar. The device formed by the deep trench etching and filling process has a uniform doping distribution, but it is difficult to adjust the doping distribution of a certain region. The device obtained by the multiple epitaxial implantation process has a periodic doping distribution, and its process is complex and time-consuming. The proposed manufacturing process can adjust the doping concentration of the top drift region, while the doping distribution of the other part is almost unaffected.

Figure 4B:
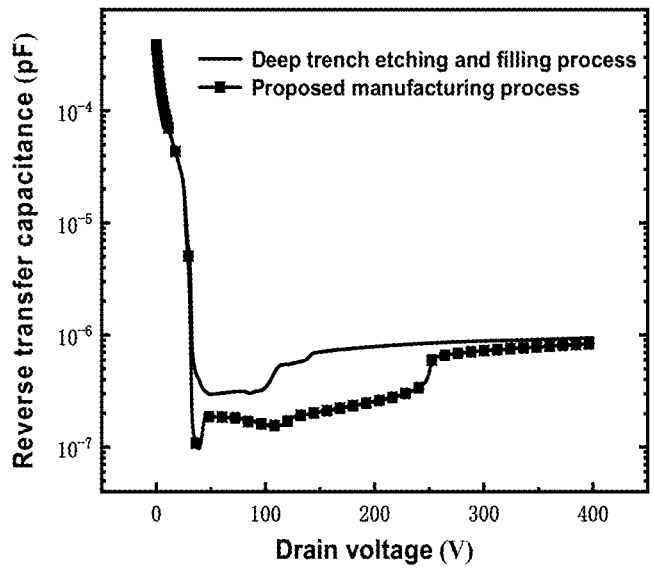
FIG. 4B compares the reverse transfer capacitance $C_{rss}$ of the super-junction MOSFET provided in Embodiment 1 with the same type super-junction MOSFET obtained by only using a deep trench etching and filling process in the prior art.

FIG. 4B compares the simulated $C_{rss}$ of the super-junction MOSFETs of different manufacturing processes. The pinch-off phenomenon occurs at low drain voltage. When the drain voltage reaches about 30V, the $C_{rss}$ drops rapidly. For this embodiment, the first type modulation region 105 can be depleted at a lower drain voltage due to the adjustment of the concentration of the top drift region. As a result, the source-drain capacitive coupling is more significant. Compared to other super-junction MOSFETs, the device formed by the proposed manufacturing process has a smaller minimum $C_{rss}$. As the drain voltage continues to increase, the depletion region further expands. $C_{rss}$ rises and finally become stable. Benefiting from the introduced second type modulation region 106, the top drift region is difficult to fully deplete. Non-fully depletion leads to a more significant source-drain capacitive coupling, which suppresses the electric field coupling between the gate and drain. As a result, the proposed device has a smaller $C_{rss}$ in the range of 100V to 250V, and rises at a larger turning voltage about 250V.

Figure 4C:
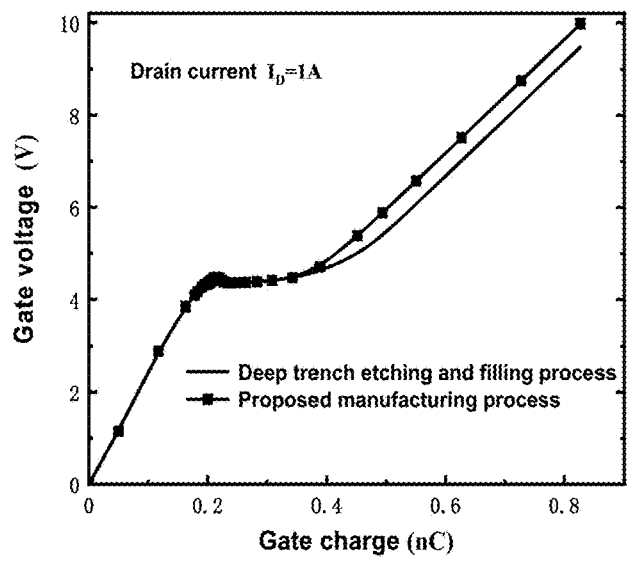
FIG. 4C compares the gate charging process of the super-junction MOSFET provided in Embodiment 1 with the same type super-junction MOSFET obtained by only using a deep trench etching and filling process in the prior art.

FIG. 4C compares the simulated gate charging process of the super-junction MOSFETs of different manufacturing processes. Compared to the embodiment of FIG. 2, the device in this embodiment adjusts the concentration of the top drift region. The first type modulation region 105 is easy to deplete, therefore the proposed device has a shorter Miller plateau, less gate charge, and faster switching speed.

To sum up, the semiconductor device obtained by this embodiment has the advantages of simple process, low cost and small cell-pitch. Besides, the proposed method can flexibly modify capacitance characteristics, thereby realizing improved dynamic characteristics.

Embodiment 2

Figure 5A:
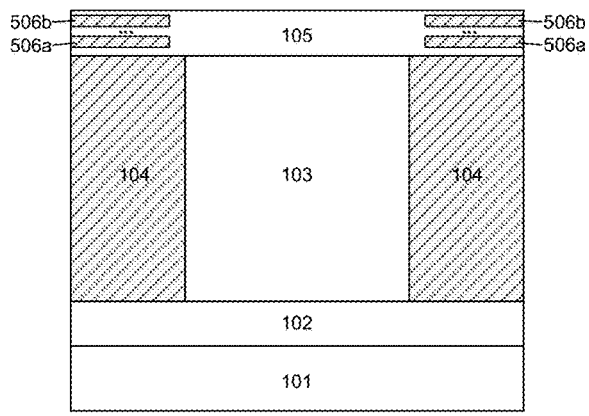
FIG. 5A is a schematic structural diagram obtained after the first type modulation region and the second type modulation region are formed by multiple ion implantation after single-layer epitaxy in the process flow of Embodiment 2 of the present invention.
Figure 5B:
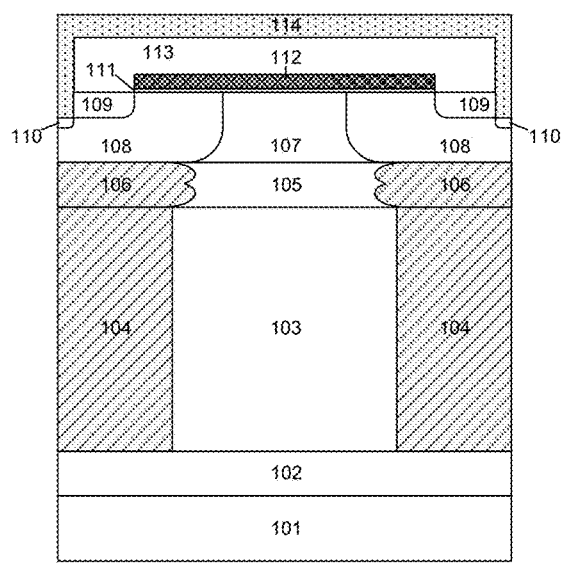
FIG. 5B is a schematic structural diagram of a semiconductor device according to Embodiment 2 of the present invention.

As shown in FIG. 5A and FIG. 5B, this embodiment provides a manufacturing method of a semiconductor device, which is different from embodiment 1 in that the first type modulation region 105 and the second type modulation region 106 are formed by multi-implantation after a single-layer epitaxy.

As shown in FIG. 5A, after the first type modulation region 105 is formed on the upper surfaces of the first type drift region 103 and the second type compensation region 104, a first type ion implantation is performed to form the first modulation doping region 506a. Subsequently, anion implantation is performed to form the second modulation doping region 506b, and the ion implantation may be continued as necessary. The dose and energy of each ion implantation can be different, and further, if the design requires, the mask of each implantation can be different. Based on the process of multi-implantation after a single-layer epitaxy, the second type modulation regions 106 with various depths and concentrations can be formed in the first type modulation region 105 after an annealing process.

Compared to the process of Embodiment 1, in which only one ion implantation is performed after a single epitaxy, the doping distribution of the second type modulation regions 106 in this embodiment is more uniform. Less thermal budget is needed to connect the second type body region 108 and the second type modulation region 106. Less thermal budget is needed to connect the second type modulation region 106 and the second type compensation region 104, reducing the compensation of the first type modulation region 105 and the second type modulation region 106. Taking FIG. 5B as an example, the second type modulation region 106 is formed by twice implantations with different energy after a single epitaxy. The diffusion distance required to connect the second type modulation region 106 is reduced by half, therefore the thermal budget is reduced.

Compared to the process in which only one ion implantation is performed in a single epitaxy in Embodiment 1, the adjustment of doping concentration for the second type modulation region 106 is more flexible. The second type modulation region 106 can realize a non-uniform doping distribution. For example, the doping dose of each implantation is different, in which a larger doping dose is used for the implantation with a lower energy. After annealing, the step-shaped doping distribution in which doping concentration decreasing from top to bottom can be achieved. In the process of depletion, the step-shaped doping distribution can avoid the sudden change of capacitance. Therefore, oscillation of voltage and current is suppressed during switching. Besides, a smaller $C_{rss}$ can be achieved at high drain voltage.

The adjustment of doping distribution for the first type modulation region 105 and the second type modulation regions 106 is flexible in this embodiment, which is beneficial to the modification of the pinch-off and the depletion process. It realizes the optimization of the dynamic characteristics.

Embodiment 3

Figure 6A:
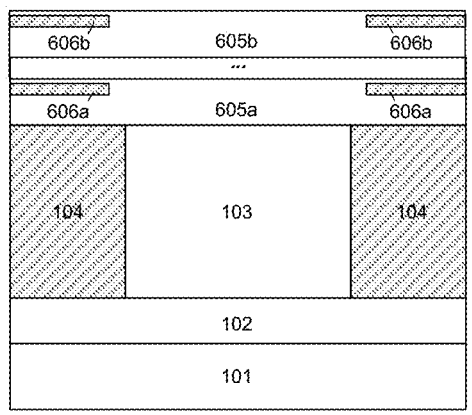
FIG. 6A is a schematic structural diagram obtained after forming the first type modulation region and the second type modulation region by multi-layer epitaxy and ion implantation on each epitaxial layer in the process flow of Embodiment 3 of the present invention.
Figure 6B:
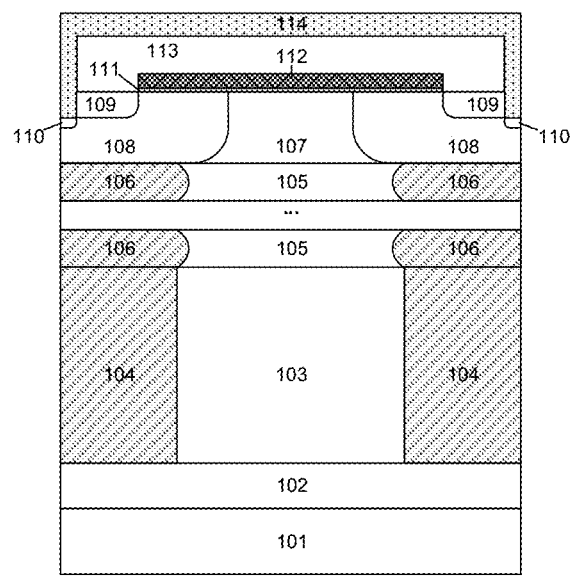
FIG. 6B is a schematic structural diagram of a semiconductor device according to Embodiment 3 of the present invention.

As shown in FIG. 6A and FIG. 6B, this embodiment provides a manufacturing method of a semiconductor device, which is different from Embodiment 1 in that the first type modulation region 105 and the second type modulation region 106 are formed by multi-layer epitaxy and one or more implantations after a single epitaxy.

As shown in FIG. 6A, after the first type drift region 103 and the second type compensation region 104 is formed by planarization in step 4 of Embodiment 1, forming the first type first layer modulation doping region 605a by epitaxy on the upper surface of the first type drift region 103 and the second type compensation region 104; Forming the second type first layer modulation doping region 606a by ion implantation with a mask; Forming the first type second layer modulation doping region 605b by epitaxy; Forming the second type second layer modulation doping region 606b by ion implantation with a mask. The epitaxy and implantation processes can be further repeated as demand. After the annealing process, the first type modulation region 105 and the second type modulation regions 106 are composed of a plurality of consecutive and overlapping doping regions, as shown in FIG. 6B.

The adjustment of doping distribution for the first type modulation region 105 and the second type modulation region 106 is flexible. Compared to Embodiment 2, a thicker modulation region with a uniform concentration distribution can be formed. For example, the first type first modulation region 605a and the second type first modulation region 606a have smaller thicknesses than that of the first type modulation region 105 in Embodiment 2, therefore the high-energy ion implantation can be avoided. Meanwhile, the total thickness of the twice epitaxy in this embodiment can be larger than that of the first type modulation region 105 in the embodiments of FIG. 2 and FIGS. 5A-5B. The proposed method in this embodiment is beneficial to realize the optimization of the dynamic characteristics, but needs to make a trade-off with the process complexity according to the demand.

Embodiment 4

In this embodiment, the first type modulation region 105 can separate the second type compensation region 104 and the second type modulation region 106 by adjusting the thickness of the first doping type epitaxy, the energy of the ion implantation, and the temperature/time during the subsequent annealing.

Figure 7:
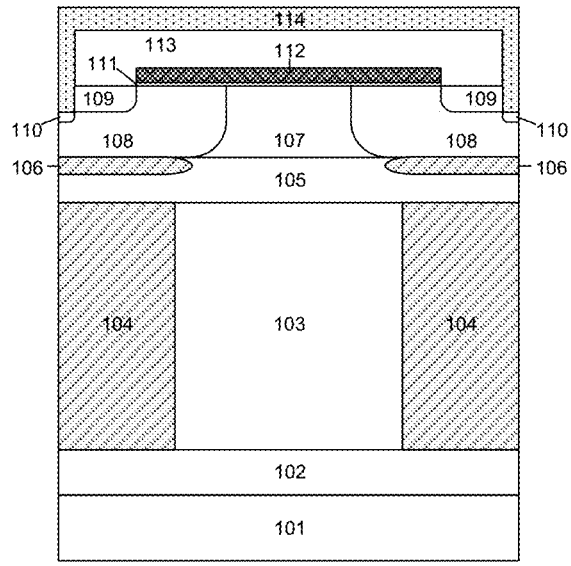
FIG. 7 is a schematic structural diagram of a semiconductor device according to Embodiment 4 of the present invention.

The device structure obtained by the process of this embodiment is shown in FIG. 7. The high-impact ionization region is transferred from the first type drift region 103 to the bottom of the second type modulation region 106. The proposed method in this embodiment is convenient to adjust the doping distribution of the second type modulation region 106. Furthermore, the proposed device in this embodiment can reduce the collision ionization rate and collect holes at the bottom of the second type modulation region 106. Benefiting from the above advantages, the proposed device can significantly reduce the holes in the second type body region and suppresses the parasitic BJT triggering. The proposed device can effectively shorten the path of hole current and reduce the max reverse recovery current ($I_{RR}$) of the body diode while extending the reverse recovery time.

Embodiment 5

This embodiment provides a manufacturing method of a semiconductor device, which differs from Embodiment 1 in that, before epitaxy and etching filling are performed in step 3 of Embodiment 1 to form a super-junction drift region, a first type bottom modulation region 805 is formed on the upper surface of the first type buffer layer 102 by epitaxy and the ion implantation. A plurality of second type bottom modulation regions 806 are formed by ion implantation with a mask.

Figure 8:
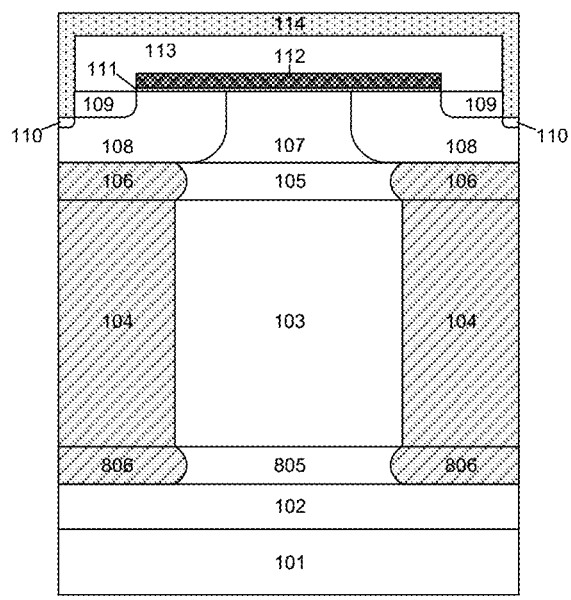
FIG. 8 is a schematic structural diagram of a semiconductor device according to Embodiment 5 of the present invention.

The device structure obtained by the process of this embodiment is shown in FIG. 8. Compared to Embodiment 1, this embodiment can flexibly adjust the doping concentration at the bottom of the drift region. It is effective to modify the depletion at the bottom of the first type drift region 103 under high drain voltage. For example, the doping concentration of the second type bottom modulation region 806 is lower than that of the second type compensation region 104, and the doping concentration of the first type bottom modulation region 805 is higher than that of the first type drift region 103. Therefore, compared to the device with only the first type drift region 103 in Embodiment 1, the bottom of the drift region in this embodiment is harder to deplete. The boundary of the depletion region is recessed into the first type bottom modulation region 805. The device has a larger drain-source capacitance (CDs). Besides, the second type bottom modulation region 806 is beneficial to adjust the doping concentration at the bottom of the device. As a result, the electric field distribution is optimized, and a higher BV can be achieved.

Embodiment 6

This embodiment provides a manufacturing method of semiconductor device, which is different from Embodiment 1 in that the inclination angle φ of the trench sidewalls in the step 3 can be adjusted in a range of 0° to 5°.

Figure 9:
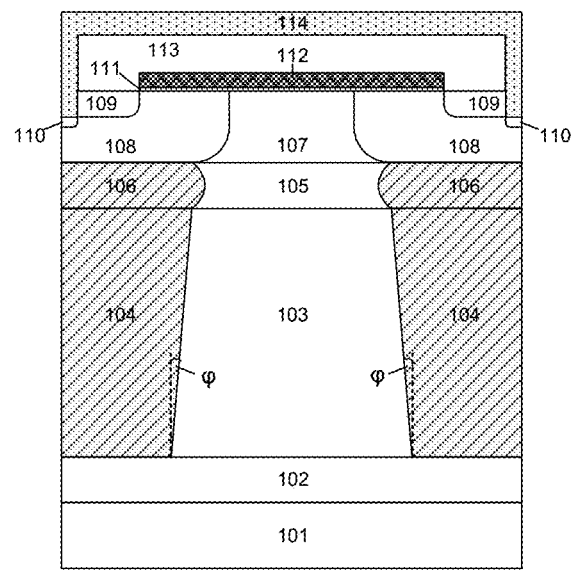
FIG. 9 is a schematic structural diagram of a semiconductor device according to Embodiment 6 of the present invention.

The embodiment can adjust the doping dose of the drift region by the small inclination deep trench etching, so that the alternately arranged first type drift region 103 and second type compensation regions 104 achieve a non-uniform dose distribution. The dose of the first type drift region 103 is reduced from top to bottom, and dose of the second type compensation region 104 is reduced from bottom to top. The device structure obtained by the process of this embodiment is shown in FIG. 9.

While the total charge dose of the first type drift region 103/the second type compensation regions 104 remains balanced, the non-uniform distribution leads to a small decrease in the off-state BV. However, the process tolerance is significantly improved. In this embodiment, the small inclination deep trench etching technology and modulation regions both contribute to a large top dose. The top of the drift region in the super-junction MOSFET has a larger second type doping dose. The bottom of drift region in the super-junction MOSFET has larger first type doping dose. At high drain voltage, the depletion of the first type drift region 103 and the second type modulation region 106 can be modified to enhance the drain-source capacitive coupling, leading to the improved dynamic characteristics.

Embodiment 7

This embodiment provides a manufacturing method of a semiconductor device, which is different from the Embodiment 1 in that a novel mask is introduced to replace the corresponding mask in step 6. The second type modulation regions 106 are alternately arranged with the first type modulation region 105. The second type modulation region 106 separates the first type modulation region 105 at intervals in the gate width direction.

Figure 10B:
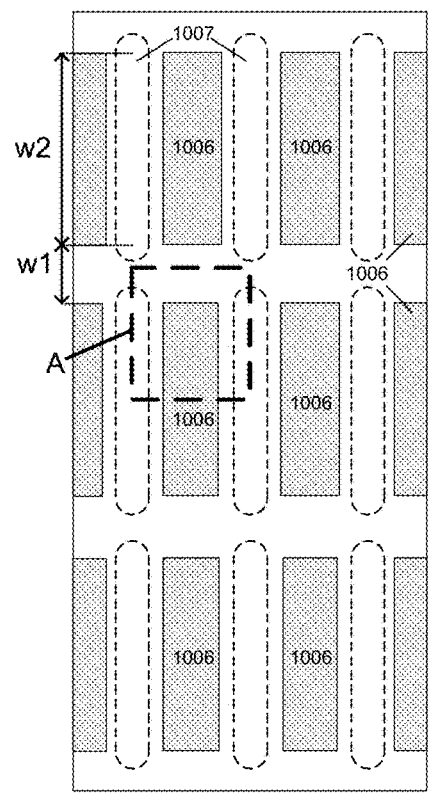
FIG. 10B is a schematic structural diagram of the mask adopted in step 6 in the process flow of Embodiment 7 of the present invention.
Figure 10C:
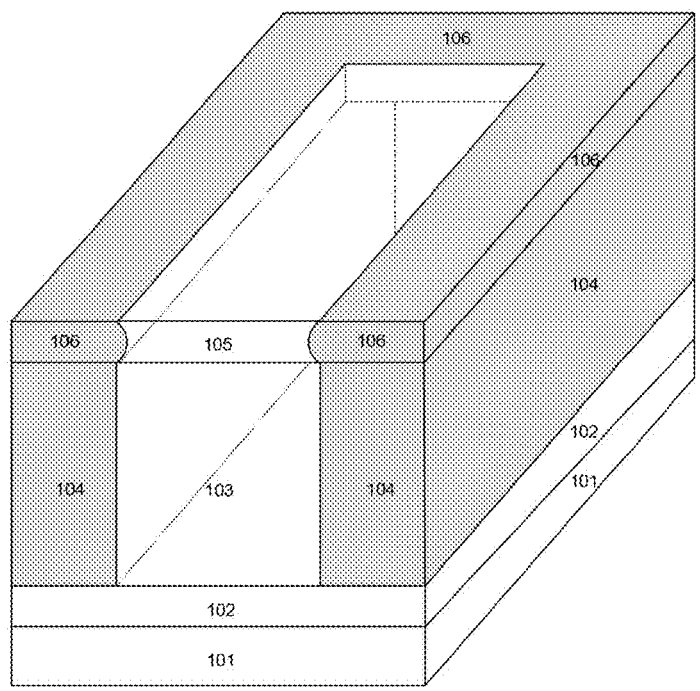
FIG. 10C is a perspective view of the three-dimensional structure according to Embodiment 7 of the present invention.

The ion implantation in step 6 of Embodiment 1 adopts a mask as shown in FIG. 10A. Under the shielding of the shielding region 1006, the ion implantation is performed to form the top structure of the super-junction device. In this embodiment, the mask shown in FIG. 10B is used to replace the mask shown in FIG. 10A for the ion implantation. FIG. 10C is a perspective structure view below the surfaces of the first type modulation region 105 and the second type modulation regions 106 within a range of a dotted box A of FIG. 10B. After a subsequent annealing process, the second type modulation regions 106 separate the first type modulation region 105 at intervals in the gate width direction. This embodiment utilizes a region without complete current channel above the first type drift region 103. This region does not contribute to the current capability. However, it is a component of the parasitic $C_{GD}$. The second type modulation region 106 separates the first type drift region 103 from the gate dielectric layer, reducing the parasitic $C_{GD}$. Furthermore, by adjusting the layout, the proposed method can change the ratio of $C_{GD}$ and $C_{GS}$ by adjusting the ratio of the length $W_1$ to $W_2$. $W_1$ is the length of the isolated region in the first type modulation region 105, and $W_2$ is the length of the first type modulation region 105. To improve the dynamic characteristics of the device, the proposed method can extend the non-fully depleted region at the top of the drift region by increasing the ratio of $W_1$ to $W_2$, reducing the parasitic $C_{GD}$. In addition, due to the strip-shaped layout of a gate etching region in FIG. 10B, the second type body regions 108 between the gate etching regions 1007 are formed by diffusion of ion implantation in the semicircular regions at the ends of the two adjacent strip holes. The doping dose distribution of this region is different from the second type body region 108 formed by the straight edge diffusion of the strip holes. The structure and process proposed in this embodiment can conveniently adjust the charge balance around the gate etching regions 1007 while realizing capacitance adjustment. As a result, the proposed process can improve the charge imbalance at the top of the device drift region formed by self-aligned technique. The proposed process optimizes the electric field distribution at the top of the device drift region, increasing the off-state BV.

Embodiment 8

This embodiment provides a manufacturing method of a semiconductor device, which is different from the Embodiment 1 in that a novel mask is introduced to replace the corresponding mask in step 6. The second type modulation region 106 extends partly into the first type modulation region 105 at intervals in the gate width direction.

Figure 11A:
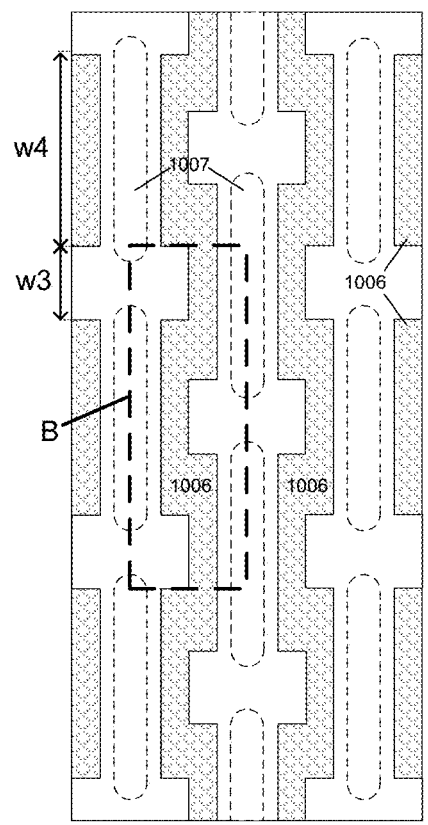
FIG. 11A is a schematic structural diagram of the mask adopted in step 6 in the process flow of Embodiment 8 of the present invention.
Figure 11B:
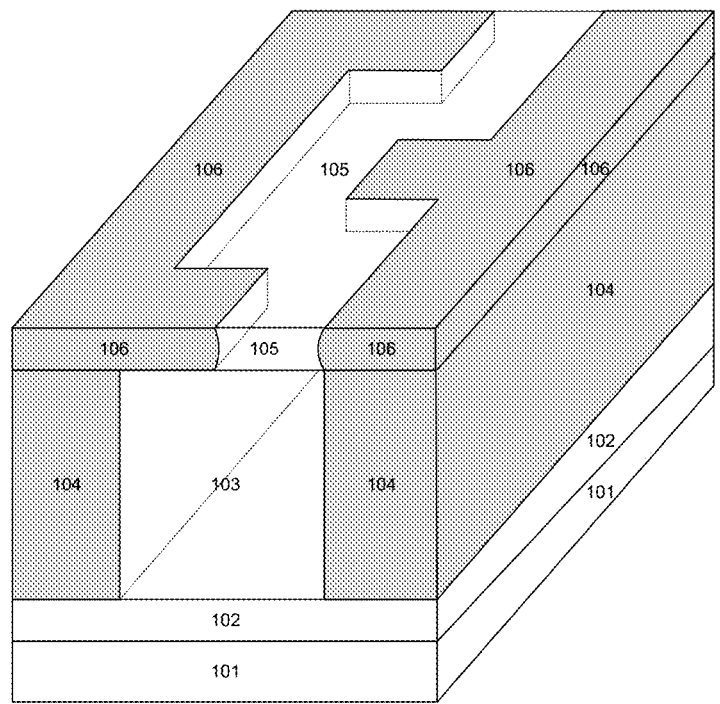
FIG. 11B is a perspective view of the three-dimensional structure according to Embodiment 8 of the present invention.

The ion implantation in step 6 of Embodiment 1 adopts a mask as shown in FIG. 10A. The shielding region 1006 can prevent the implantation of the impurity. Under the shielding effect of the shielding region 1006, the ion implantation is performed to form the top structure of the super-junction device. In this embodiment, the mask shown in FIG. 11A is used to replace the mask shown in FIG. 10A. Under the shielding effect of the shielding region 1006, the ion implantation is performed to form the top structure of the super-junction device. After the subsequent annealing process, the second type modulation region 106 extends into the first type modulation region 105 at intervals in the gate width direction. FIG. 11B shows the perspective structure below the first type modulation region 105 and the second type modulation region 106 within the range of dotted box B in FIG. 11A. This embodiment utilizes a region without a complete current channel above the first type drift region 103. The first type drift region 103 is under the gate dielectric layer. The second type modulation region 106 extending into the first type modulation region 105 has no contribution to the current capacity, but is part of the parasitic $C_{GD}$. The second type modulation region 106 separates the first type drift region 103 from the gate dielectric layer, reducing the parasitic $C_{GD}$. The proposed manufacturing process can change the ratio of $C_{GD}$ and $C_{GS}$, and improve the dynamic characteristics by adjusting the ratio of $W_3$ to $W_4$. $W_3$ is the length of the second type modulation region 106 that extends into the first type modulation region 105, and $W_4$ is the length of the first type modulation region 105. For example, the proposed method can extend the non-fully depleted region at the top of the drift region by increasing the ratio of $W_3$ to $W_4$, reducing the parasitic $C_{GD}$. In addition, for the conventional device structure, since the second type body regions 108 between the gate etching regions 1007 are formed by diffusion of ion implantation in the semicircular regions at the ends of the two adjacent strip holes, its doping distribution is different from that of the second type body regions 108 formed by straight edge diffusion of the strip holes. Therefore, it is prone to introduce charge imbalance. The structure and method proposed in this embodiment can conveniently adjust the charge balance around the gate etching regions 1007 while realizing capacitance adjustment. As a result, the proposed process improves the charge imbalance at the top of the device drift region formed by self-aligned technique. The proposed process optimizes the electric field distribution at the top of the device drift region, and increases the off-state BV.

Embodiment 9

This embodiment provides a manufacturing method of a semiconductor device, which is different from Embodiment 1 in that after forming the first type modulation region 105 in step 5, a drift region isolation layer 1215 is introduced between the alternately arranged first type drift region 103 and the second type compensation regions 104, and between the alternately arranged first type modulation region 105 and the second type modulation regions. The drift region isolation layer 1215 separates the first type drift region 103 from the second type compensation regions 104, and separates the first type modulation region 105 from the second type modulation regions 106.

Figure 12:
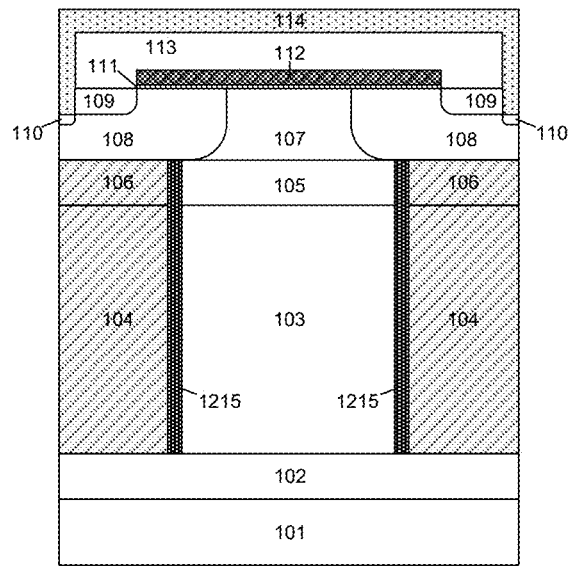
FIG. 12 is a schematic structural diagram of a semiconductor device according to Embodiment 9 of the present invention.

The device structure obtained by the proposed method of this embodiment is shown in FIG. 12. Compared to Embodiment 1, the drift region isolation layer 1215 avoid the doping compensation in the thermal processes. Therefore, the method of this embodiment can form a steeper doping distribution gradient and a smaller cell-pitch. It is beneficial for the first type modulation region 105 and the second type modulation region 106 to achieve a larger range of doping concentration. Therefore, the pinch-off and fully depleted processes can be adjusted to achieve the optimization of the dynamic characteristics. At the same time, since the permittivity of the insulating medium is smaller than that of the silicon, the introduction of the drift region isolation layer 1215 can also enhance the transverse electric field between the first type drift region 103 and the second type compensation regions 104, and between the first type modulation region 105 and the second type modulation regions 106. The transverse electric field can enhance the depletion of the first type drift region 103 and the first type modulation region 105. Therefore, the first type drift region 103 and the first type modulation region 105 can achieve a larger doping concentration, thereby reducing the $R_{on,sp}$.

Embodiment 10

This embodiment provides a manufacturing method of a semiconductor device, which is different from Embodiment 1 in that after forming the first type neck region 107 in step 7, a drift region isolation layer 1215 is introduced between the alternately arranged first type drift region 103 and the second type compensation region 104, and between the alternately arranged first type modulation region 105 and the second type modulation regions 106. In addition, after the source contact hole is formed by etching, a metal film is sputtered on the surface of the second type body region 108 to form a Schottky contact.

Figure 13:
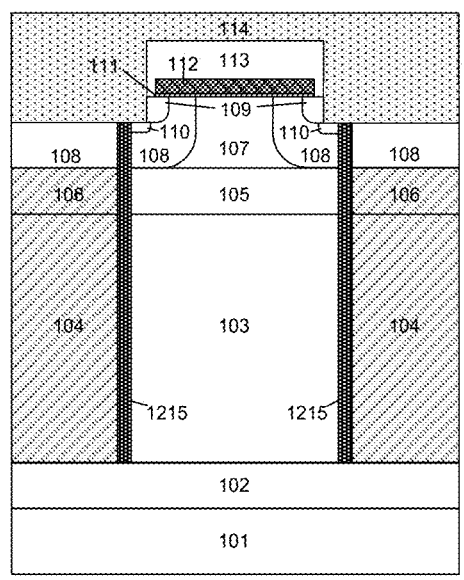
FIG. 13 is a schematic structural diagram of a semiconductor device according to Embodiment 10 of the present invention.

The device structure obtained by the process of this embodiment is shown in FIG. 13. The first type modulation region 105 and the second type modulation regions 106 can modify the depletion of the top drift region, which not only can realize the pinch-off at the top drift region at a low drain voltage, but also can optimize the dynamic characteristics. The depleted second type modulation region 106 sustains most of the drain voltage, which suppresses the influence of the Schottky barrier reduction effect in the second type body region 108 and increases the reverse BV of the Schottky junction. Furthermore, the depleted second type modulation region 106 can reduce the reverse leakage current of the Schottky junction. During the reverse recovery, the drift region isolation layer 1215 prevents electrons from injecting into the second type compensation regions 104 and the second type modulation regions 106. The reverse-biased Schottky diode prevents holes from injecting into the second type compensation region 104 and the second type modulation region 106. Therefore, the hole density in the drift region and the reverse recovery charge are reduced. The reverse recovery time is greatly shortened.

Embodiment 11

Figure 14:
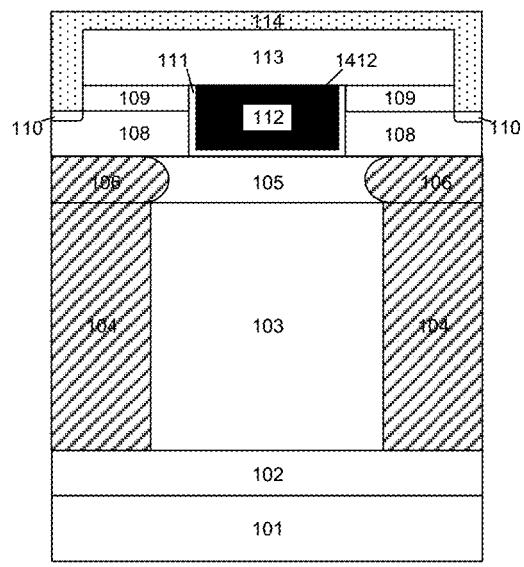
FIG. 14 is a schematic structural diagram of a semiconductor device according to Embodiment 11 of the present invention.

As shown in FIG. 14, this embodiment provides a semiconductor device, which includes: a first type substrate 101; a first type buffer layer 102 is located above the first type substrate 101; a plurality of first type drift regions 103 and second type compensation regions 104 are alternately arranged above the first type buffer layer 102; a first type modulation region 105 is located above the first type drift region 103; second type modulation regions 106 are located above the second type compensation regions 104; a trench region 1412 is located above the first type modulation region 105; a gate electrode 112 is deposited inside the trench region 1412, a gate dielectric 111 is formed to isolate the trench region 1412 and the gate electrode 112; second type body regions 108 are located above the second type modulation regions 106; the second type body regions 108 comprise a first type source region 109 and a second type body contact region 110; the second type body region 108 and the first type source region 109 are in contact with the trench region 1412; a passivation layer 113 is located above the gate structure; a source electrode 114 contacts the first type source region 109 and the second type body contact region 110.

It is different from Embodiment 1 in that a trench gate structure is adopted to avoid the resistance introduced by the first type neck region 107 in Embodiment 1. Meanwhile, since the channel direction changes from transverse to longitude, it is beneficial to realize a smaller cell-pitch, reducing the $R_{on,sp}$.

Based on the trench gate structure, the first type modulation region 105 and the second type modulation region 106 introduced in this embodiment can effectively improve the capacitive coupling between the gate and the drain. For example, the doping concentration of the first type modulation region 105 is lower than that of the first type drift region 103, and the doping concentration of the second type modulation region 106 is higher than that of the second type compensation region 104. In the off-state, the trench gate and second type modulation region 106 are grounded, therefore the first type modulation region 105 can be depleted from three directions. The device can pinch-off at low drain voltage to achieve a small $C_{rss}$. Meanwhile, because the trench gate structure can form an accumulation region at the bottom of the device in the on-state, the first type modulation region 105 in this embodiment has little impact on the $R_{on,sp}$.

Embodiment 12

Figure 15:
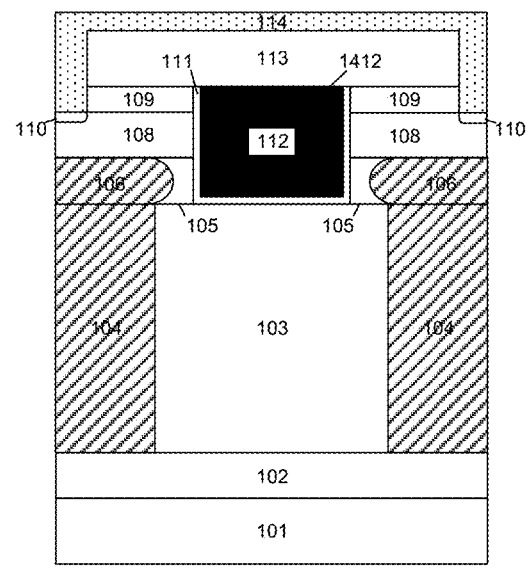
FIG. 15 is a schematic structural diagram of a semiconductor device according to Embodiment 12 of the present invention.

As shown in FIG. 15, this embodiment provides a semiconductor device, which is different from Embodiment 11 in that the top of the second type modulation region 106 is located above the bottom of the trench region 1412; the bottom of the trench region 1412 is in contact with the top of the first type drift region 103; the first type modulation region 105 is located between the two adjacent second type modulation region 106 and the trench region 1412.

In this embodiment, a larger concentration range can be adopted for the first type modulation region 105 and the second type modulation region 106 to modify the depletion distribution. For example, the doping concentration of the first type modulation region 105 is lower than that of the first type drift region 103 to realize pinch-off phenomenon at a low drain voltage, reducing the potential of the interface between the first type modulation region and the second type body region 108. With the increase of drain voltage, the first type modulation region sustains most of the potential. The first type modulation region prevents the punch-through breakdown effect in the second type body region 108, leading to a smaller channel length. Meanwhile, increasing of the doping concentration of the second type modulation region 106 can extend the incomplete depletion region at the top of the device drift region and reduce the parasitic $C_{GD}$. Compared to the structure in FIGS. 11A-11B, the first type modulation regions 105 are narrower. The first type modulation region 105 is easy to be depleted by the second type modulation region 106 and the trench region 1412. As a result, the first type modulation region 105 can achieve a higher doping concentration, reducing the $R_{on,sp}$.

The above embodiments only illustrate the principles of the present invention and its efficacy and are not intended to limit the present invention. Any person familiar with the art may modify or alter the above embodiments without departing from the spirit and scope of the present invention. Therefore, all equivalent modifications or changes made by those having ordinary knowledge in the art without departing from the spirit and technical idea disclosed by the present invention should still be encompassed by the claims of the present invention.

What is claimed is:

1. A manufacturing method of a semiconductor device, comprising:
    step 1: providing a first type substrate;
    step 2: forming a first type buffer layer on an upper surface of the first type substrate;
    step 3: forming a first first-type epitaxial layer on an upper surface of the first type buffer layer, and etching with a first mask to obtain alternately arranged trench structures;
    step 4: filling the alternately arranged trench structures with a second type semiconductor material and polishing to obtain a plurality of first type drift regions and second type compensation regions;
    step 5: forming a second first-type epitaxial layer on surfaces of the plurality of first type drift regions and the second type compensation regions, and performing a first ion implantation to adjust a concentration of the second first-type epitaxial layer;
    step 6: forming second type modulation regions on an upper surface of the second first-type epitaxial layer by a second ion implantation with a second mask;
    step 7: forming a third first-type epitaxial layer on an upper surface of a first type modulation region, and performing a third ion implantation to adjust a concentration of the third first-type epitaxial layer;
    step 8: forming a dielectric material on the upper surface of the third first-type epitaxial layer, and depositing a gate electrode material on an upper surface of the dielectric layer;
    step 9: forming a gate dielectric and a gate electrode by etching with a third mask;
    step 10: performing a fourth ion implantation by a self-aligned technique;
    step 11: forming second type body regions by annealing;
    step 12: forming first type source regions by a fifth ion implantation on upper surfaces of the second type body regions with a fourth mask;
    step 13: depositing a passivation layer on an upper surface of the semiconductor device, and etching with a fifth mask to obtain a source contact hole;
    step 14: forming second type body contact regions by a sixth ion implantation;
    step 15: forming a source electrode on the upper surface of the semiconductor device;
    wherein the semiconductor device obtained by the above steps comprises:
    the first type substrate;
    the first type buffer layer is located above the first type substrate;
    the plurality of first type drift regions and the second type compensation regions are alternately arranged above the first type buffer layer;
    the first type modulation region is located above the plurality of first type drift regions;
    the second type modulation regions are located above the second type compensation regions;
    a plurality of body structures are located above the second type modulation region;
    the plurality of body structures comprise a second type body region, a first type source region, and a second type body contact region;

a first type neck region is located between two adjacent body structures;

a gate structure is located above the upper surface of the semiconductor device;

the gate structure comprises the gate dielectric and the gate electrode located above an upper surface of the gate dielectric;

the passivation layer is located above the gate structure; and the source electrode is deposited on the gate structure contacting the first type source region and the second type body contact region.

2. The manufacturing method of claim 1, wherein the second type modulation regions and the second type compensation regions have different doping concentrations.

3. The manufacturing method of claim 1, wherein the first type modulation region and the second type modulation region are formed by a multi-implantation after a single epitaxy.

4. The manufacturing method of claim 1, wherein the first type modulation region is formed by a multi-epitaxy process, and the second type modulation region is formed by a multi-epitaxy and one or more ion implantations after each epitaxy.

5. The manufacturing method of claim 1, wherein the second type compensation region is not in contact with the second type modulation region.

6. The manufacturing method of claim 1, wherein before an epitaxy in step 3, a first type bottom modulation region is formed on the upper surface of the first type buffer layer, and a second type bottom modulation region is formed by a seventh ion implantation.

7. The manufacturing method of claim 1, wherein an inclination angle φ of the alternately arranged trench structures in step 3 is adjusted in a range of 0° to 5°.

8. The manufacturing method of claim 1, wherein in step 6, the second mask is a strip-shaped mask used to obtain the second type modulation region, and the strip-shaped mask is arranged periodically with the first type modulation region.

9. The manufacturing method of claim 1, wherein in step 6, the second mask isa fork-shaped mask used to obtain the second type modulation region, and the fork-shaped mask is arranged periodically with the first type modulation region, wherein the second type modulation region extends into the first type modulation region at intervals.

10. The manufacturing method of claim 1, wherein after forming the first type modulation region in step 5, a drift region isolation layer is introduced by a deep trench etching with a deposition or an oxidation, the drift region isolation layer separates the drift region and the second type compensation region, and the drift region isolation layer separates the first type modulation region and the second type modulation region.

11. The manufacturing method of claim 1, wherein after forming the first type neck region in step 7, a drift region isolation layer is introduced by a deep trench etching with a deposition or an oxidation, the drift region isolation layer separates the drift region and the second type compensation region, the drift region isolation layer separates the first type modulation region and the second type modulation region, wherein after etching the source contact hole in step 13, a metal film is sputtered on the upper surface of the second type body region to form a Schottky contact.

12. The manufacturing method of claim 1, wherein a first type is n-type while a second type is p-type, or the first type is p-type and the second type is n-type.

13. The manufacturing method of claim 2, wherein a first type is n-type while a second type is p-type, or the first type is p-type and the second type is n-type.

14. The manufacturing method of claim 3, wherein a first type is n-type while a second type is p-type, or the first type is p-type and the second type is n-type.

15. The manufacturing method of claim 4, wherein a first type is n-type while a second type is p-type, or the first type is p-type and the second type is n-type.

16. The manufacturing method of claim 5, wherein a first type is n-type while a second type is p-type, or the first type is p-type and the second type is n-type.

17. The manufacturing method of claim 6, wherein a first type is n-type while a second type is p-type, or the first type is p-type and the second type is n-type.

18. The manufacturing method of claim 7, wherein a first type is n-type while a second type is p-type, or the first type is p-type and the second type is n-type.

* * * * *